(12) United States Patent
Andrieu

(10) Patent No.: US 7,480,340 B2
(45) Date of Patent: Jan. 20, 2009

(54) SIGNAL ESTIMATION METHODS AND APPARATUS

(75) Inventor: Christophe Andrieu, Bristol (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 1184 days.

(21) Appl. No.: 10/714,900

(22) Filed: Nov. 18, 2003

(65) Prior Publication Data

US 2004/0161059 A1    Aug. 19, 2004

(30) Foreign Application Priority Data

Nov. 28, 2002    (GB)    ................................ 0227770.5

(51) Int. Cl.
*H04B 7/02*    (2006.01)
*H03D 1/00*    (2006.01)

(52) U.S. Cl. ...................... 375/267; 375/341

(58) Field of Classification Search ................ 375/232, 375/233, 260, 262, 265, 267, 341, 347
See application file for complete search history.

(56) References Cited

U.S. PATENT DOCUMENTS 5,467,374 A    11/1995    Chennakeshu et al.
6,330,294 B1 *    12/2001    Ansbro et al. ............... 375/347
6,768,517 B2 *    7/2004    Limberg et al. ............. 348/614
7,333,539 B2 *    2/2008    Glendenning ............... 375/232
2007/0030919 A1 *    2/2007    Li .............................. 375/267

FOREIGN PATENT DOCUMENTS

EP    0 593 404 A1    4/1994

* cited by examiner

*Primary Examiner*—Don N. Vo
(74) *Attorney, Agent, or Firm*—Oblon, Spivak, McClelland, Maier & Neustadt, P.C.

(57) ABSTRACT

A method and an apparatus for estimating likelihood values for signals of a sequence of signals transmitted from a transmitter through a channel to a receiver. The method employs a plurality of particles, each particle having a postulated transmitted signal history, and includes initializing a set of particles, evolving the set of particles over time to generate a succession of evolved sets of particles, tracing a plurality of paths through the succession of evolved sets of particles backwards in time, and determining a sequence of likelihood values for the transmitted sequence of signals using the paths. Communication systems in which a receiver receives signals from a transmitter with a plurality of transmit antennas, such as MIMO (Multiple-Input Multiple-Output) systems are able to use this method.

36 Claims, 9 Drawing Sheets

SIGNAL ESTIMATION METHODS AND APPARATUS

FIELD OF THE INVENTION

This invention is generally concerned with methods, apparatus, and computer program code for estimating signals, in particular signals from a transmitter for a mobile communications system. The invention is particularly useful for communications systems in which a receiver receives signals from a transmitter with a plurality of transmit antennas, such as MIMO (Multiple-Input Multiple-Output) systems.

BACKGROUND OF THE INVENTION

All digital communication receivers are faced with the task of estimating the transmitted signal with the greatest degree of accuracy, while performing the operation as rapidly and simply as possible. In practice, there is an inevitable trade-off between decoding accuracy and speed of processing.

It is possible to exhaustively search all of the possible signal combinations that, when modified by the channel, could have resulted in the received signal. Unfortunately, this process, of considering every conceivable signal combination that could have generated a specific signal is extremely complex. The problem is compounded for high data rate systems that employ multiple element transmit and receive antennas.

A particular problem arises in a communications links where a transmitter with more than one transmit antenna is employed since signals received from different transmit antennas interfere with one another. This results in so-called multi-stream interference (MSI) and causes decoding difficulties. The potential advantage, however, is greatly increased throughput (that is, a higher bit rate) for such a communications link. In this type of MIMO (Multiple-input Multiple-output) communication link the "input" (to a matrix channel) is provided by the transmitter's plurality of transmit antennas and the "output" (from a matrix channel) is provided by a plurality of receive antennas. Thus each receive antenna receives a linear combination of signals from all the transmitter's transmit antennas and the separate signals sent from each transmit antenna must be extracted from this combination.

A typical wireless network comprises a plurality of mobile terminals (MT) each in radio communication with an access point (AP) or base station of the network. The access points are also in communication with a central controller (CC) which in turn may have a link to other networks, for example a fixed Ethernet-type network. Until recently considerable effort was put into designing systems so as to mitigate for the perceived detrimental effects of multipath propagation, especially prevalent in wireless LAN (local area network) and other mobile communications environments. However it has been recognised that multipath propagation can be used to an advantage, as in effect, this uniquely affects or labels a spatial path, facilitating the separation of the superposition of signals at the receiver. Work G. J. Foschini and M. J. Gans, "On limits of wireless communications in a fading environment when using multiple antennas" *Wireless Personal Communications* vol. 6, no.3, pp. 311-335, 1998 has shown that by utilising multiple antenna architectures at both the transmitter and receiver (a so-called multiple-input multiple-output (MIMO) architecture) increased channel capacities are possible (in effect, spatial multiplexing). Attention has also turned to the adoption of space-time coding techniques (in OFDM, space-frequency coding) for wideband channels. Typically channel state information (CSI) for maximum likelihood detection of such coding is acquired via training sequences and the resulting CSI estimates are then fed to a Viterbi decoder.

Another technique for space-time code detection in a MIMO system based upon the use of periodic pilot sequences and interpolation filters is described in A. Naguib, V. Tarokh, N Seshadri and A. Calderbank "A space-time coding based model for high data rate wireless communications" IEEE J-SAC vol. 16, pp. 1459-1478. Octocber 1998. However this is a diversity technique which does not directly increase the bit rate.

FIG. 1 shows a simple example of MIMO communication system 100 in which an information source 102 provides information symbols s(t) at time t which are transmitted simultaneously, that is, spatially multiplexed, from transmit antennas 104. These symbols can be interrelated through coding. A plurality M of receive antennas 106 receives respectively signals $r_1(t), \ldots r_m(t)$ which are input to receiver 108. The receiver 108 provides on output 110 an estimate $\hat{s}(t)$ of the transmitted symbol $\hat{s}(t)$. There is a plurality of channels between the transmit and receive antennas, for example all channels with two transmit antennas and two receive antennas. Periodic pilot sequences in the transmitted signal may be used to estimate the time varying responses of these channels.

Third generation mobile phone networks use CDMA (Code Division Multiple Access) spread spectrum signals for communicating across the radio interface between a mobile station and a base station. These 3G networks are encompassed by the International Mobile Telecommunications IMT-2000 standard (www.ituint) and the UMTS (Universal Mobile Telecommunications System) system is the subject of standards produced by the Third Generation Partnership Project (3GPP, 3GPP2), technical specifications for which can be found at www.3gpp.org. Fourth generation mobile phone networks and other communications systems, although not yet defined, may employ MIMO-based techniques.

In practical data communication systems multipath propagation within a channel results in intersymbol interference (ISI), which is often corrected with a combination of equalisation and forward error correction (FEC) coding. For example a linear equaliser effectively deconvolves the received data from the channel impulse to produce data estimates with ISI substantially removed. Alternatively OFDM may be employed to effectively define a series of narrowband channels and avoid ISI by the use of a guard interval and cyclic prefix. An optimal equaliser may employ maximum likelihood (ML) sequence estimation or maximum a priori estimation (MAP), for example using a Viterbi algorithm. Where data has been protected with a convolutional code a soft input Viterbi decoder may be employed, usually together with data interleaving to reduce the effects of burst errors. Such approaches provide optimal equalisation but become impractical as the symbol alphabet size and sequence length (or equivalently channel impulse response length) increases.

Turbo equalisation achieves results which are close to optimal but with substantially reduced complexity compared to non-iterative joint channel equalisation and decoding. Broadly speaking turbo equalisation refers to an iterative process in which soft (likelihood) information is exchanged between an equaliser and a decoder until a consensus is reached. The effect of the channel response on the data symbols is treated similarly to an error correction code and typically a soft output Viterbi algorithm (SOVA) is used for both. Again, however, such techniques are impractically complex for large delay spreads and symbol alphabets, particularly as several processing iterations may be needed to achieve convergence for a single data block. These difficulties are significantly exacerbated where signals from more than one transmit antenna must be disentangled and equalised, with a different channel response for each transmit antenna or transmit-receive antenna pair.

The exhaustive search described above, grows exponentially in complexity with the number of channel taps, the size of the constellation and the number of MIMO sub-channels. For practical MIMO systems this optimum solution imposes far too heavy a burden on the processor of the receiver.

An alternative detection method to exhaustive searching is to use computationally simpler linear filtering, which performs decoding based on minimisation of some error metric, such as minimum mean square error (MMSE). Unfortunately, these methods have relatively poor performance for MIMO systems.

Outside the context of telecommunications systems, where different problems are encountered, a particle filtering-based statistical technique has been used for speech processing (see W. Fong, S. J. Godsill, A. Doucet, and M. West, "*Monte Carlo smoothing with applications to audio signal enhancements*", IEEE Trans Signal Proc, vol 50, no 2 pp 438-488, 2002).

There is therefore a need for reduced computational complexity equalisation and decoding methods and apparatus, for example, for applications in MIMO systems.

SUMMARY OF THE INVENTION

According to the present invention there is therefore provided a method of estimating values for signals of a sequence of signals transmitted from a transmitter through a channel to a receiver, providing a received signal, the method employing a plurality of particles, each particle comprising a postulated transmitted signal history, the method comprising: initialising a set of said particles; evolving said set of particles over time using said received signal to generate a succession of evolved sets of particles; tracing a plurality of paths through said succession of evolved sets of particles backwards in time; and determining a sequence of values for said transmitted sequence of signals using said paths.

The estimated values will generally be signal likelihood values, providing a soft output. Although in some embodiments a hard output may be provided this will usually be determined by making a decision on an internally determined soft probability or likelihood value for a signal of the sequence of signals. In general the signals for which likelihood values are being determined comprise modulation symbols. A priori information may be employed in said evolving, or in said tracing, or in both.

Broadly speaking the method employs statistical tools to circumvent an exhaustive search by considering only a subset of possible combinations. Embodiments of the method look only at the most likely combinations, thereby obtaining good performance whilst significantly reducing the computational load. A useful compromise may thus be obtained between the exhaustive state-space search strategies mentioned above, which have good performance but high complexity, and techniques based upon linear filtering of the received signal, such as MMSE, which although simple have relatively poor performance.

In embodiments a particle filtering-type approach is employed in which a so-called particle represents a portion of signal history, the particle having an associated weight which is governed by the likelihood of this signal history. Instead of searching all possible signal histories only a subset of them, represented by these particles, is examined. A Monte Carlo based technique that approximates large sums by selecting mainly only statistically significant terms may be employed in selecting the particles or some other selection method may be used. Preferably each particle has an associated weight and the set of particles is evolved by choosing successive sets of particles, corresponding to successive instants of time, by selecting from a larger set of candidate successor particles and associated candidate particle weights. The selection may be made from all possible candidates or, where there is a large number of potential states and hence candidates, a subset of the possible candidates may be chosen, for example by means of a Markor Chain Monte Carlo (MCMC) algorithm such as a Gibbs Sampler. It is preferable to evolve the set of particles by picking new particles for a set from a cohort comprising all possible evolutions from each particle of the previous set. Thus in going from set to successive set it is not necessarily the case that each particle has a successor.

The weights for the candidate successor particles are preferably determined using the received signal, preferably taking into account the channel impulse response. In this way knowing the received signal and the channel response the likelihood of a transmitted signal can be determined so that a particle corresponding to a relatively more likely transmitted signal can be given a greater weight than one corresponding to a less likely transmitted signal. In this way each successive set of evolved particles will tend to include more particles for those transmitted signals which are more likely. Optionally any a priori information relating to the transmitted signal may also be included in this weighting. The weights for the candidates determine a probability distribution for picking the particles. Where relatively few particles are employed accurate representation of a peaky distribution may be difficult, and in this case it may be preferable to flatten the distribution, for example by multiplying it by a flattening function.

The channel response may be determined in a conventional manner, using a training sequence or it may be determined jointly with estimation of the transmitted signal sequence. The latter has the advantage of reducing the overhead imposed by incorporating a training sequence within the data traffic, which can be as much as 15 to 20%. For example an initial channel estimate may be employed to determine an estimate for a transmitted signal sequence which may in turn be employed to determine a better channel estimate and, if necessary, this procedure may be iterated a number of times or until a desired degree of convergence is obtained. The initial estimate of the channel response may be an assumption of the channel response or may be based upon an approximate channel response but determined for a different frequency and/or time than that desired. In another approach the algorithm may in effect be implemented twice in a cross connected fashion to jointly determine the channel response (which evolves in a Markovian manner) and the signal sequence, the channel response output from one algorithm providing an input to the signal estimation algorithm, and vice-versa. An estimate of the variants of the noise within the channel may also be obtained using these techniques (for channel estimation) for use within the signal sequence estimation algorithm.

The path tracing preferably starts with a particle in an end evolved set and continues by selecting a transition from this particle to a particle of an earlier (in time) set, successive transitions to earlier sets being selected in a stepwise fashion to build up the path. Again, preferably the transitions are selected according to a weighting which depends upon the likelihood of the transition; forbidden transitions may be given a weighting of zero. Allowed transitions are those between particles which have a common history over the channel length but less one tap (since one state is given). Allowed transitions may be allocated a uniform weight for the weight of a transition may be dependent upon a priori information where available. The process of selecting a transition from available options may be random or deterministic, for example selecting the most likely transitions. However as with the selection of particles in the forward (evolving) direction a random selection is preferred for statistical reasons. (This tends to retain less likely but nevertheless possible results).

The sequence of likelihood values for the transmitted sequence of signals may be determined by determining the likelihood of a most likely transmitted signal value at each time instant represented by one of the evolved sets of particles. The most likely transmitted signal value may be determined by counting the number of paths through particles of the set of particles and the relevant time instant. The most likely signal value at the time instant is that having the greatest number of associated particles through which paths pass. It will be appreciated that where a hard rather than a soft output is desired the determination of a transmitted signal likelihood value need only be implicit since the transmitted signal may be estimated simply by choosing signal values by counting the number of paths. It will be appreciated that the technique may be employed to provide a soft output, that is a sequence of likelihood values for the transmitted sequence of signals, or a hard output, that is an estimate of the transmitted sequence based, in effect, upon a decision made upon signal likelihood.

It will be recognised that the above-described signal sequence estimation procedure may be applied more than once in an iterative fashion, for example using the output of a first pass application of the method to provide a priori information for a subsequent application of the procedure.

In a corresponding aspect the invention provides a signal estimator for estimating values for signals of a sequence of signals transmitted from a transmitter through a channel to a receiver providing a received signal, the estimator employing a plurality of particles, each particle comprising a postulated transmitted signal history, the estimator comprising: means for initialising a set of said particles; means for evolving said set of particles over time using said received signal to generate a succession of evolved sets of particles; means for tracing a plurality of paths through said succession of evolved sets of particles backwards in time; and means for determining a sequence of values for said transmitted sequence of signals using said paths.

The invention further provides a signal processor configured to provide a soft output of transmitted signal values from a received signal comprising: a first filter configured to generate a time sequence of sets of samples from populations of candidate samples weighted using said received signal, each sample corresponding to a sequence of transmitted signal values; a second filter to select a plurality of time sequences of said samples from said time sequence of sets of samples; and a signal estimator to estimate a sequence of transmitted signal values from said plurality of sample time sequences to provide said soft output.

Preferably the first filter comprises a particle filter; preferably the second filter comprises a statistical sampler.

The skilled person will recognise that the above-described methods apparatus may be implemented using and/or embodied in processor control code. Thus in a further aspect the invention provides such code, for example on a carrier medium such as a disk, CD- or DVD-ROM, programmed memory such as read-only memory (Firmware) or on a data carrier such as an optical or electrical signal carrier. Embodiments of the invention may be implemented on a DSP (Digital Signal Processor), ASIC (Application Specific Integrated Circuit) or FPGA (Field Programmable Gate Array). Thus the code may comprise conventional program code, or microcode, or, for example, code for setting up or controlling an ASIC or FPGA. In some embodiments the code may comprise code for a hardware description language such as Verilog (Trade Mark) or VHDL (Very high speed integrated circuit Hardware Description Language). As the skilled person will appreciate, processor control code for embodiments of the invention may be distributed between a plurality of coupled components in communication with one another.

BRIEF DESCRIPTION OF THE DRAWINGS

These and other aspects of the invention will now be further described, by way of example only, with reference to the accompanying figures in which.

DETAILED DESCRIPTION

Figure 1:
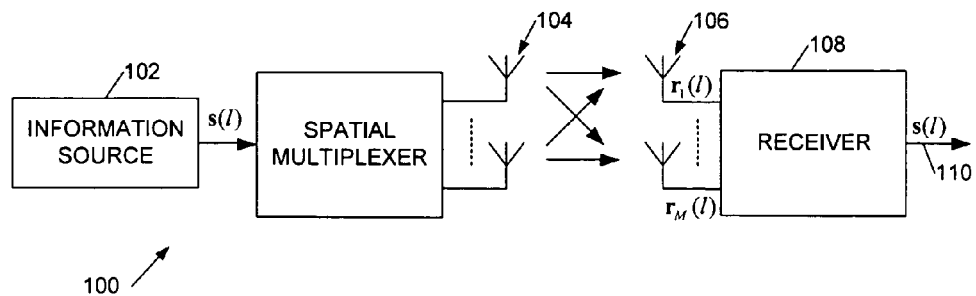
FIG. 1 shows a known MIMO space-time coded communications system.
Figure 2:
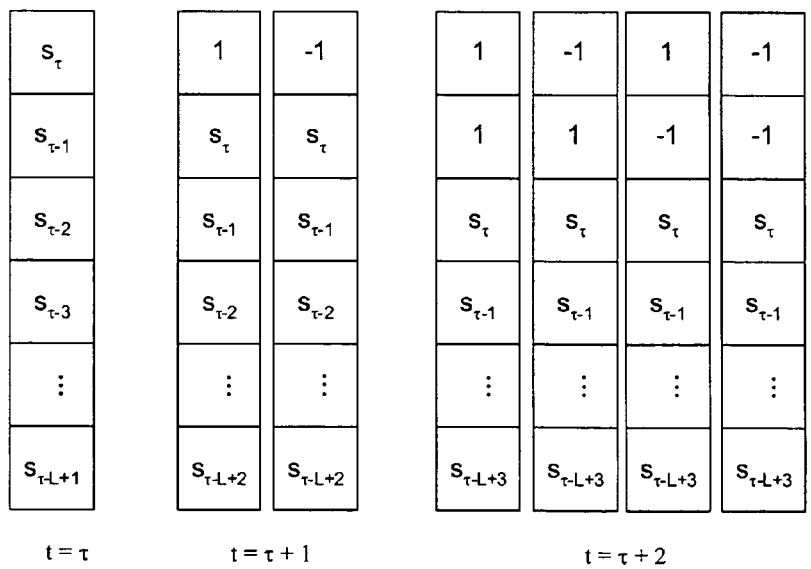
FIG. 2 shows possible signal histories transmitted from one of a plurality of transmit antennas at successive time instants, based on BPSK.

Consider a processing algorithm which, in a receiver, has to estimate a sequence of signals $s_{i,t}$, i=1, ..., m, t=1, ..., T that has passed through a dispersive channel where m is the number of transmit antennas and T is the duration of the transmitted signal over which decoding occurs. FIG. 2 illustrates, for BPSK (binary phase shift keying) signals, how the number of possible signal combinations from a start time τ grows exponentially over time.

Considering a multiple-input, multiple-output (MIMO) channel with m transmitting and n receiving antennas, using a constellation (or alphabet) of $n_s$ (possibly complex) symbols, the received signal can be written as:

$$y_{j,t} = \sum_{i=1}^{m} h_{i,j}^T x_{i,t} + \xi_{j,t}, \quad j = 1, \ldots, n \qquad \text{Equation 1}$$

where T denotes a matrix transpose oeration, $h_{i,j} \in \mathbb{C}^{L \times 1}$ is the channel impulse response (CIR) from TX antenna i to RX antenna j, L is the number of taps in the CIR of the channel, $\xi_{j,t}$ is the channel noise and $x_{i,t} = (s_{i,t}\ s_{i,t-1} \ldots s_{i,t-L+1})^T$ is the signal history of (L) transmitted symbols $s_{i,t}$ on TX antenna i at time t. By collecting the signals from all TX antennas, the full signal history is $x_t=(x_{1,t}^T x_{2,t}^T \ldots x_{m,t}^T)^T$.

In practice, it may be impossible to consider all signal histories $x_t$ that could have been transmitted and therefore they may be represented by a subset of most probable signal histories, which are termed 'particles' q. These are discussed further below.

The desired (soft) output from which the transmitted signals can be estimated is obtained from the marginal posterior probability distribution:

$$p(s_{i,t} | y_{1:n,1:T}) = \sum_{s_{v,u}: v \neq i, u \neq t} p(s_{1:m,1:T} | y_{1:n,1:T}) \quad \text{Equation 2}$$

where p(a|b) denotes the probability of a given b. Here the probability of a transmitted symbol being correct given that a particular signal is being received determined.

An efficient algorithm known as the BCJR algorithm (named after its inventors Bahl, Cocke, Jelinek and Raviv: L. Bahl, J. Cocke, F. Jelinek, and J. Raviv, "*Optimal Decoding of Linear Codes for Minimizing Symbol Error Rate*," IEEE Trans. on Inf. Theory, pp. 284-287, March 1974) already exists for determining this distribution. This algorithm is used in many trellis-based processing applications which need a posterior probability information, such as channel equalization and decoding. Unfortunately, processing complexity is proportional to the number of states, which grows exponentially with constellation size, number of transmitting antennas and channel length. Hence, for many applications, the complexity is too high for the BCJR algorithm to be practical.

The method described below is a compromise between complexity and performance, and provides a solution that is within the reach of emerging processing hardware. Instead of the BCJR algorithm, particle filtering is used to estimate the marginal posterior distributions.

The method is a computationally less complex approximation to the BCJR algorithm and uses a Monte Carlo based technique, known as particle filtering, that approximates large sums by selecting only statistically significant terms. Instead of searching all possible signal histories, only a subset of them is examined. These are represented by particles which have a signal history, over the length of the channel, L, and an associated weight that is governed by the likelihood of this signal history.

A particle represents the last L signals that were transmitted where the signal is the net combined signal from all of the antennas. A new set of particles must be generated for each new time step up to a time T. Also associated with a particle is a numerical value, later termed a weight, relating to the likelihood of the portion of signal history the particle represents.

In outline the algorithm picks a set of N such particles at each time instant t. The set of particles is selected from a larger set comprising all possible signal histories (of length L) or a preselected subset of these. At each time instant the new possible signal histories from those retained by the previous particles are evolved to the next instant and a new set of N particles is drawn. This process is repeated for a total duration T and the resulting N·T particles are referred to herein as the particle grid. The algorithm may be generalised so that the grid retains any number of particles at each time instant, provided that exponentially increasing complexity is mitigated. The grid does not necessarily include a possible evolution of each previous particle and the same particle may be included more than once in the set. Each particle that is drawn from the larger set of extended signal histories has an associated weight which determines the likelihood of it being selected. The weight is based upon the received signal so that a particle which is relatively more likely given the received signal has a greater weight. The weight also takes into account the response of the channel between the transmitter and receiver and any a priori information about the underlying signal. Construction of the particle grid is the first stage of the procedure.

After the particle grid has been constructed a number of paths are traced back through the grid, thus providing a second statistical sampling operation. Each path begins at a randomly selected chosen from the final set, at time t, which is then connected by a transition to a particle at preceding time t−1, and this is repeated back to the start of the particle grid to build up a path. Transitions are only allowed between particles which share a common signal history over the channel length minus one (particles of adjacent times in the grid have an overlap in their histories) and the number of possible transitions depends upon the particles available in the grid. Selection of a transition may be made randomly or (preferably) on a weighted random basis, for example taking into account some a priori knowledge, say from a decoder in a turbo equaliser. Construction of backward paths is the second stage of the procedure.

Once a plurality of such paths has been constructed they can be used to estimate the transmitted signal. For example, at a time t, for transmit antenna i, to determine the likelihood that $s_{i,t}$ has a value +1 say the number of particles at that time instant that lie on paths and have a value of $s_{i,t}=+1$ is counted and divided by the total number of paths to yield the probability of $s_{i,t}=+1$. (Particles at other time instants, although they may include a value for $s_{i,t}$, are not counted). This gives an estimate of the probability that a particular symbol was transmitted at a given time given the received signal and this may either be used to make a decision on the symbol or to provide a soft output, for example for a channel decoder. In an iterative process a priori information may be used in the forward, particle filter process to adjust the particle selection weights, and/or in the reverse, path tracing process to adjust the transition weights. It will be recognised that within the particle grid there are many particles which carry information about one transmitted symbol. It will also be recognised that there need not be a particle with a signal history corresponding to the actually transmitted signal history for the method to correctly determine a transmitted signal or symbol.

In greater detail, the operation of the algorithm is as follows:

0. Initialisation

At the beginning of the algorithm all of the particles are usually initialised to zero, which denotes no previous signal history. However, as with the BCJR algorithm, any initial conditions may be used.

1. Forward Filtering Via Particle Filter

Figure 3A:
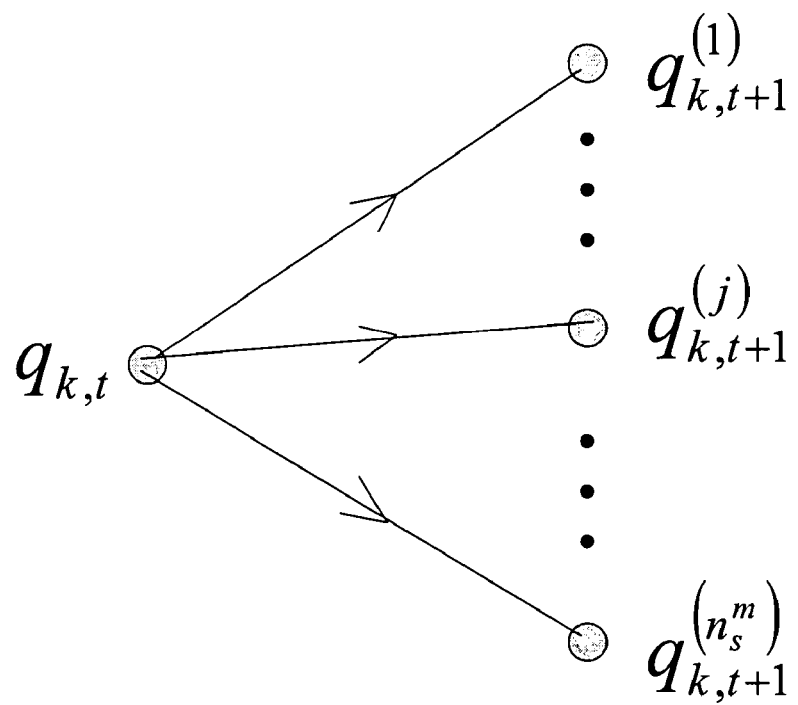
FIGS. 3a and 3b show, respectively, forward evolution of a particle with a plurality ($n_s^m$) of candidate transitions, and backward transition candidates in a grid of particles.

At a subsequent time, t+1, the received signal $y_{t+1}=(y_{1,t+1} \; y_{2,t+1} \ldots y_{n,t+1})$ is observed. With m transmit antennas considered, with each additional signal drawn from $n_s$ possible signals, $n_s^m$ possible evolutions of the particle $q_{k,t}$ are produced, where k denotes the kth particle. The newly evolved particles $q_{k,t+1}^{(j)}$, $j=1, \ldots, n_s^m$ are based on the $n_s^m$ possible transitions one can make from particle $q_{k,t}$, as illustrated in FIG. 3*a*. (Here k represents a particular particle of a set N but there is no explicit relationship between a particle k at time t and at t+1). The likelihood of each new signal history $q_{k,t+1}^{(j)}$ can be computed from the observed value $y_{t+1}$ and any a priori information. If $q_{k,t+}^{(j)}$ is given, a potential transmitted symbol history $s_{1:m,t-L+2:t+1}$ is known and hence the likelihood of observing $y_{t+1}$ is found from:

$$w_{k,t+1}^{(j)} = p(y_{t+1}|q_{k,t+1}^{(j)})p(q_{k,t+1}^{(j)}|q_{k,t})$$ Equation 3

In equation 3 the value of $p(y_{t+1}|q_{k,t+1}^{(j)})$ may be determined using equation 1 since if $q_{k,t+I}$ is given so is the signal history and hence the term within the summation sign is known. This allows $$y_{j,t} - \sum_{i=1}^{m} h_{i,j}^T x_{i,t}$$

to be determined for each receive antenna (here j labelling a receive antenna) and hence the noise term $\xi_{j,t}$ to be computed. Then assuming, say, a Gaussian noise distribution the probability of the computed noise term can also be determined.

In practice, the signal set of the constellation and the number of transmit antennas may be so large that there is still a large proliferation in states as one moves from one time instant to the next. Consequently, in some circumstances it may be better to pre-select a subset of these states, rather than generate them all and then cull most of them. This may, for example, be implemented by a Gibbs sampler or more generally a MCMC sampler. For further details reference may be made to Liu, J. S. (2001). Monte Carlo Strategies in Scientific Computing. Springer-Verlag; Gilks et al. (1998), Markov chain Monte Carlo in Practice, Chapham & Hall; and Casella, G. and George, E. I. (1992), Explaining the Gibbs sampler, American Statistician, 46 167-174.

The channel impulse response may be estimated in a conventional manner, using a training sequence, as is well known to those skilled in the art. For example in one channel estimation procedure the coefficients of an adaptive digital filter are modified so that the behaviour of the filter matches, as closely as possible, the behaviour of a transmission channel being modelled. A known training signal is applied both to the transmission channel and the adaptive filter providing the channel estimate. The estimated channel response is subtracted from the actual response to create an error signal which is fed back to update the filter coefficients according to an adaption algorithm such as a Recursive Least Square (RLS) or Least Mean Square (LMS) algorithm or a variant thereof, or more sophisticated methods that rely on Monte Carlo or EM techniques. Such algorithms are well-known to the skilled person, and reference may also be made to Lee and Messerschmitt, "Digital Communication", Kluwer Academic Publishers, 1994.

In a MIMO system each transmit antenna may transmit one of a set of substantially orthogonal training sequences, allowing these training sequences to be separated at the receiver and a channel estimate to be determined for each link from a transmit antenna to a receive antenna. An example of such a channel estimator is described in Ye Geoffrey Li, "Simplified channel estimation for OFDM systems with multiple transmit antennas", IEEE Transactions on Wireless Communications, Vol. 1, No. 1, pg. 67, January 2002, which is hereby incorporated by reference. If desired, in embodiments the channel estimation may be performed iteratively, using the estimated transmitted symbols as additional training symbols.

The factor $p(q_{k,t+1}^{(j)}|q_{k,t})$ in equation 3 represents any a priori knowledge of the transition. If no such information is available, all transitions are assumed to be equally probable and $$p(q_{k,t+1}^{(j)}|q_{k,t}) = \frac{1}{n_s^m}$$

if there is a connection between $q_{k,t}$ and $q_{k,t+1}^{(j)}$, otherwise $p(q_{k,t+1}^{(j)}|q_{k,t})=0$. Note that the weights $w_{k,t+1}^{(j)}$ are based on the likelihood of observing $y_{t+1}$ and not any previous observations. Hence no accumulation of likelihoods or weights is done and $w_{k,t+1}^{(j)}$ can be compared to a branch metric in a trellis-based equaliser.

With N particles, the enlarged set of $N \cdot n_s^m$ candidate particles $q_{k,t+1}^{(j)}$ can then be used to generate a probability distribution:

$$f_{t+1}(k, j) = \frac{w_{k,t+1}^{(j)}}{\sum_{k=1}^{N} \sum_{j=1}^{n_s^m} w_{k,t+1}^{(j)}},$$ Equation 4

$$k = 1, \ldots, N, j = 1, \ldots, n_s^m$$

This probability distribution is, in effect, a normalisation of the weights of equation 3.

To prevent the number of possible signal histories from growing exponentially over time, N particles are then selected from the total set of $N \cdot n_s^m$ according to their weights. One possible selection method comprises randomly drawing N particles from the probability distribution $f_{t+1}(k,j)$. This means that an evolved candidate particle $q_{k,t+1}^{(j)}$ with a high value $f_{t+1}(k,j)$ associated with it, has a high probability of being picked. This facilitates picking the most likely particles while not completely discarding particles with a low likelihood. There are of course many other ways the selection of N particles can be made (for example, picking those with the largest weights) and the above is just one, albeit preferred example.

We have described how the particles are drawn from a probability distribution calculated from the received signal and any a priori information. In some circumstances, this may not be the optimum solution for choosing the reduced set of signal histories that are considered, particularly where the number of particles is small and therefore may not be wholly representative of the true probability density function (PDF). In these cases an improvement may be obtained by flattening the PDF by a mathematical transformation (for example, by multiplying by a flattening function), so that the diversity of signal histories is increased. By keeping certain signal histories, which would previously have been deemed too unlikely, there is a chance that the probability of these histories will dramatically improve at future instants. This process provides some protection against using too few particles and can offer increased resilience to system impairments. Other strategies that 'search ahead' for a small number of time steps may also be used to obtain a more global picture, at the expense of increased complexity.

Figure 4:
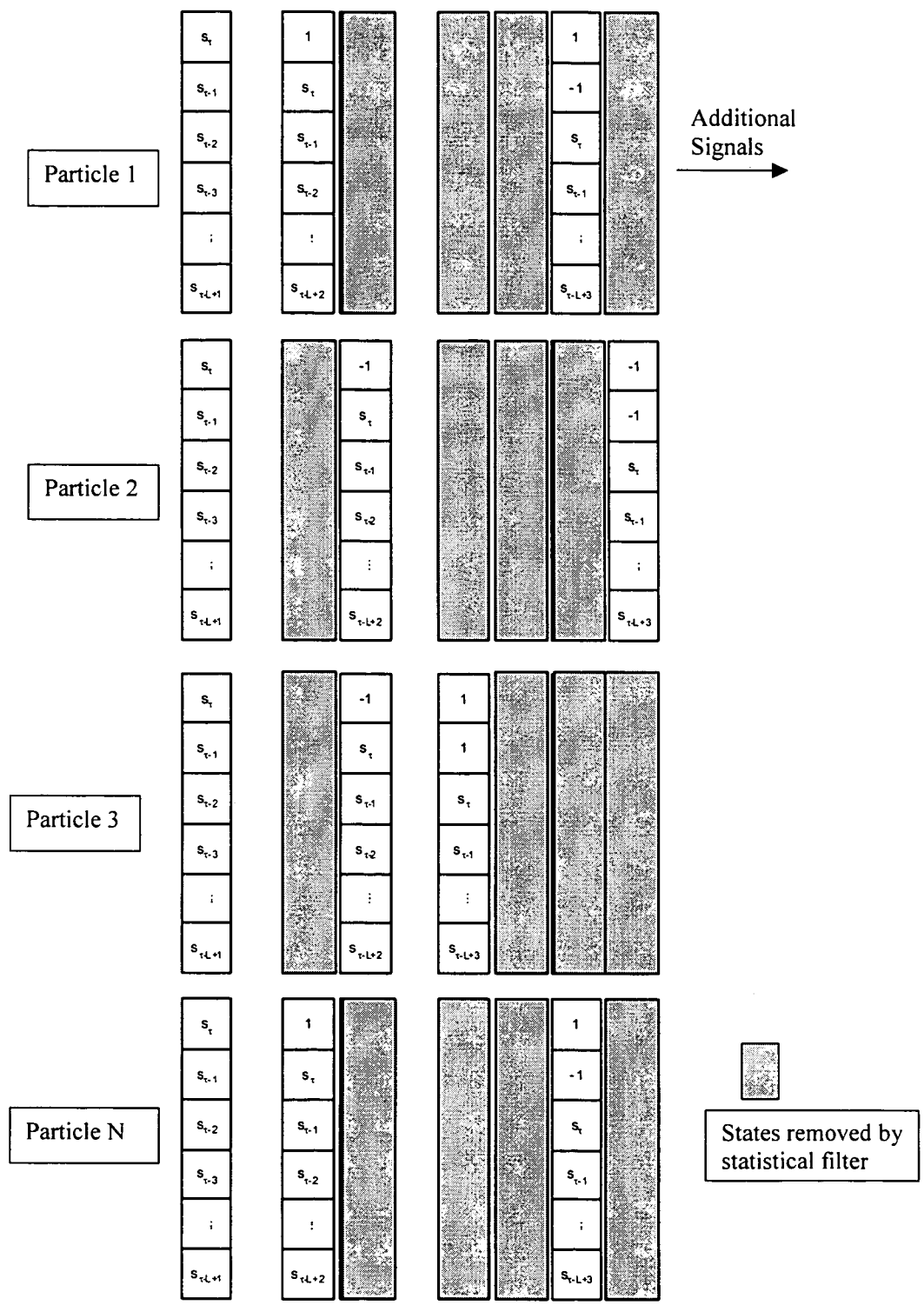
FIG. 4 shows culling of possible signal histories based on statistical sampling for a single particle.

FIG. 4 illustrates the statistical reduction of the number of candidates, culling the possible signal histories to avoid exponential growth in complexity, using this Monte Carlo particle filter technique. For example in a BPSK MIMO system with two transmit and two receive antennas (m=2) and a channel length of L=7 selection of 100 particles (N=100) has proven satisfactory. In general, however, a suitable value for N is best determined empirically as it grows with the size of constellation $n_s$ and number of antennas m and is also subject to the channel characteristics and the level of noise/interference. It is generally preferable to over-determine N, that is to err on the side of a larger N, to provide a margin for error.

This forward filtering process is repeated until the end of the sequence has been reached, i.e. t=T. This results in a total of N×T particle values which form a particle-time grid, that is referred to here as a particle grid.

Figure 5:
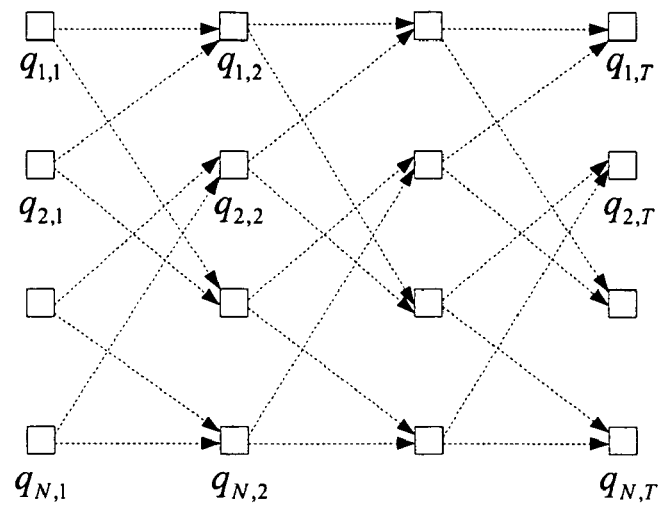
FIG. 5 shows a particle grid and examples of allowed transitions between particles in the grid.

FIG. 5 illustrates a simplified example of such a particle grid also showing examples of allowed transitions between particles in the grid as explained further below. It should be appreciated that the transition shown in FIG. 5 do not represent the above-described forward evolution process since this is not performed by evolving each particle separately, but rather by choosing particles from a cohort representing (in the presently described embodiment) all possible candidates. Thus it can be seen that there is not necessarily a connection between $q_{k,t}$ and $q_{k,t+1}$ since these particles are picked independently. FIG. 5 appears to show a regular pattern but in practice the allowed transitions will appear more random. However the particles will tend to cluster around the more likely signal histories and signal values.

2. Backward Smoothing on the Filter Grid

The purpose of the backward algorithm is to randomly choose a family of M reverse paths through the particle grid (from t=T to 1), where M may be more or less than N. In one embodiment each path is generated by starting at the last time instant T and randomly choosing (uniformly) one of the particles and its associated signal history, (although other ways of selecting the first particle may be employed). A particle at time t−1 is then randomly picked according to its likelihood.

Figure 3B:
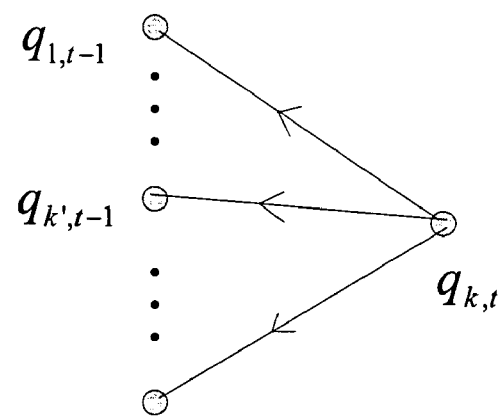

FIG. 3*b* diagrammatically illustrates backward transition candidates in the particle grid. On the particle grid there are a number of particles $q_{k',t-1}$ connecting with $q_{k,t}$; these are the particles sharing a common signal history over the channel length less one (since one state is given). The probability of a transition from $q_{k,t}$ to $q_{k',t-1}$ is proportional to the weight of the transition:

$$\tilde{w}_t(k',k) = p(s_t) I(q_{k',t-1}, q_{k,t}) \qquad \text{Equation 5}$$

Here $s_t$ is the symbol that would cause a transition between the signal histories associated with $q_{k',t-1}$ and $q_{k,t}$, and $I(q_{k',t-1}, q_{k,t})$ is an indicator function that is 1 if there is a connection between the signal histories associated with $q_{k',t-1}$ and $q_{k,t}$ and 0 otherwise. The indicator function can take account of allowed transitions between symbols, for example allowed transitions of a coding state machine at the transmitter.

A probability distribution can be formed by normalisation:

$$\tilde{f}_t(k', k) = \frac{\tilde{w}_t(k', k)}{\sum_{k'=1}^{N} \tilde{w}_t(k', k)} \qquad \text{Equation 6}$$

A random transition for particle k at time t to time t−1 is then drawn from this distribution. Note if there is no connection between $q_{k,t}$ and $q_{k',t-1}$, the probability $\tilde{f}_t(k',k)=0$ and the transition cannot be chosen. This process is then repeated for all other previous time instances back to time t=1.

If available, any a priori information enters the algorithm as transition probabilities $p(s_t)$. For example if $s_t$ is known this determines the transition, but if no a priori information is available a uniform probability may be chosen, so that in BPSK for example p(+1)=0.5.

Figure 6:
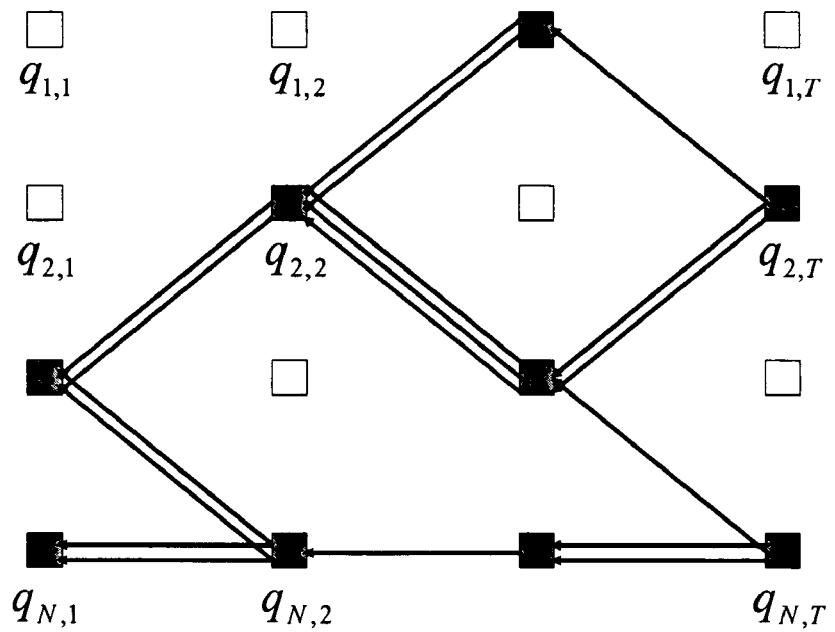
FIG. 6 shows examples of statistically picked reverse paths through a grid of particles.

Each trace-back provides one possible eventuality of a complete signal history $s_{1:m,1:T}$. This sampling of the paths is then repeated a total of M times to generate a set of histories that are distributed approximately according to the joint posterior distribution. This process is illustrated in FIG. 6, for six such paths.

3. Estimation of Distributions

The final step is to calculate the marginal posterior probability distribution from these M paths. This may then be used to estimate the transmitted sequence, or used as an input to a turbo decoder. In practice, this is accomplished by considering, at each time instant t, the number of times that paths created in step 2 pass through a particular particle. As each particle $q_{k,t}$, k=1, . . . , N is related to a particular value of $s_t$ through its associated signal history, the distribution of $s_t$ can be estimated from the distribution of $q_{k,t}$. For instance, say there are M=9 paths, N=4 particles and $q_{1,t}$ and $q_{3,t}$ are associated with $s_{i,t}=1$ and $q_{2,t}$ and $q_{4,t}$ are associated with $s_{i,t}=-1$. If there are 3, 1, 0, 5 paths passing through $q_{1,t}, q_{2,t}, q_{3,t}, q_{4,t}$, respectively, then the probabilities are:

$$p(s_{i,t} = 1 \mid y_{1:n,1:T}) = \frac{3+0}{3+1+0+5} = \frac{1}{3}$$

and $$p(s_{i,t} = -1 \mid y_{1:n,1:T}) = \frac{1+5}{3+1+0+5} = \frac{2}{3}.$$

These marginal probability distributions can now be used to make a decision $\tilde{s}_{i,t}$ on the transmitted symbols: if $p(s_i, t=1|y_{1:n,1:T}) > p(s_{i,t}=-1|y_{1:n,1:T})$ then $\tilde{s}_{i,t}=1$, otherwise $\tilde{s}_{i,t}=-1$. Alternatively soft output in the form of log-likelihoods can be produced, $$\log \frac{p(s_{i,t} = 1 \mid y_{1:n,1:T})}{p(s_{i,t} = -1 \mid y_{1:n,1:T})},$$

which be the input to a channel decoder. In general, any kind of useful output can be formed from the marginal probability distributions.

It will be appreciated that calculation of the required probability distributions using the above-described particle filter techniques may be partially conducted in parallel, and thus this 'semi-exhaustive' search strategy lends itself to rapid processing and makes the technique attractive for near-term practical implementation. For example, in the forward algorithm each of a plurality of processors may be configured to sample the distribution a plurality of times to select particles from the candidates or, in the extreme, one processor may be allocated to each selected particle. In the reverse algorithm the paths for tracing may be distributed between the available processors and each processor may be allocated some paths or just one path to trace.

The above described technique patent has assumes knowledge of the channel H and the noise variance $\sigma^2$. Where this is not the case a Gibbs sampler or expectation maximisation (EM) algorithm may be used to alternately estimate the channel parameters and the received signal. Alternatively, an "online" version of the algorithm be used that concurrently estimates the channel parameters and the signal.

The technique has been described with particular reference to the evolution of signals over time in a channel which imposes some mutual dependence on the particles. However the skilled person will appreciate that the technique may be used in evolving data over any coordinate(s) where there is a mutual dependence between data elements. Thus a variant of the technique may be employed in the frequency domain, for example where there is coding across frequencies so that transition probabilities within the particle grid are meaningful. Likewise variants of the technique may be employed where there is joint evolution in both the time and frequency domain.

The skilled person will recognise that the above-described reduced complexity decoding is of generic use in communication receivers. It is particularly advantageous for systems that use multiple antennas and/or which operate in highly temporally dispersive channels and/or which have high data rates. Applications include wireless local area networks (WLAN's) and future cellular systems (3G and beyond).

Figure 7:
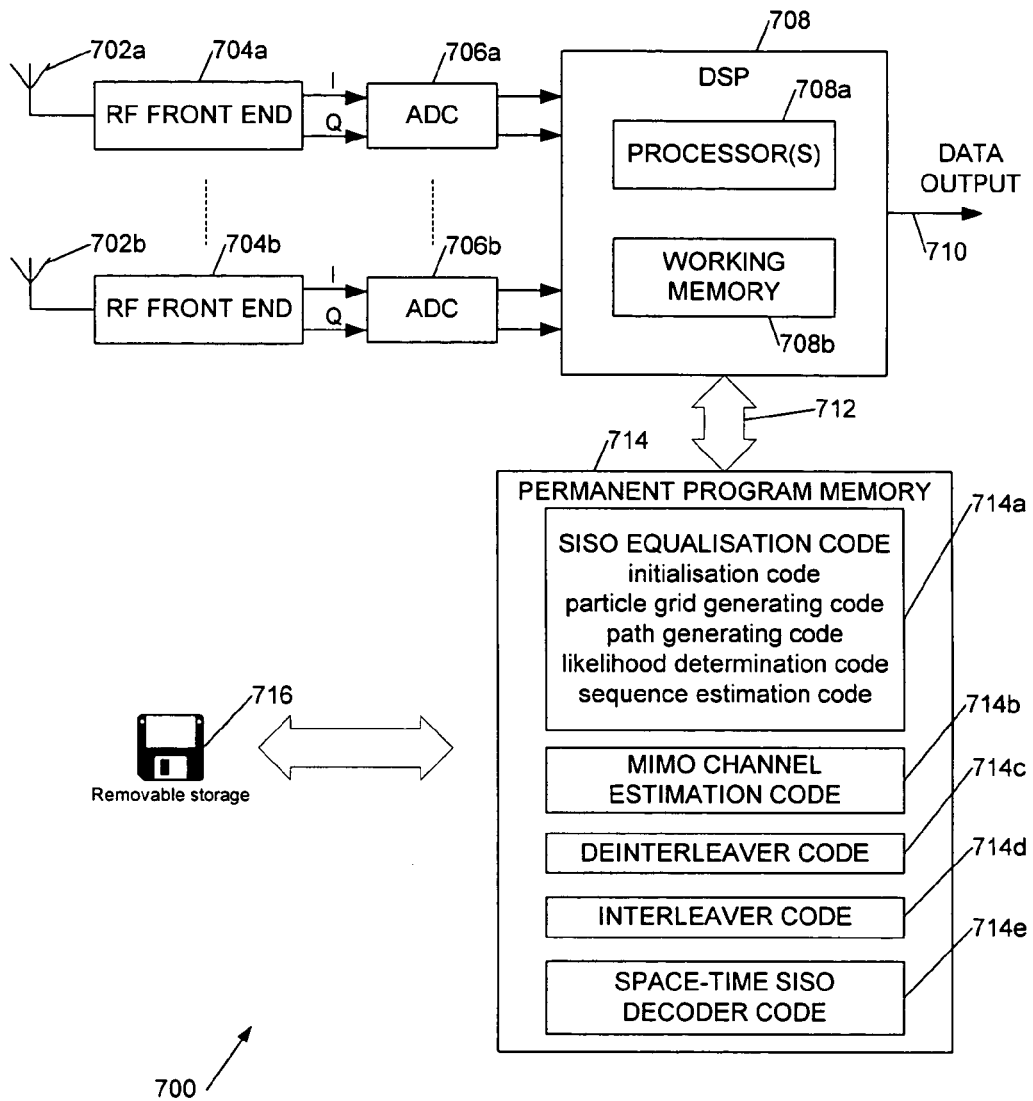
FIG. 7 shows a receiver incorporating an equaliser configured to operate in accordance with an embodiment of an aspect of the present invention.

Referring now to FIG. 7, this shows an embodiment of a receiver 700 incorporating a equaliser configured to operate in accordance with the above-described method, to estimate transmitted symbols.

Receiver 700 comprises one or more receive antennas 702a,b (of which two are shown in the illustrated embodiment) each coupled to a respective rf front end 704a,b, for example similar to the rf front end of FIG. 2a, and thence to a respective analogue-to-digital converter 706a,b and to a digital signal processor (DSP) 708. DSP 708 will typically include one or more processors 708a (for example, for a parallel implementation of filter 414) and some working memory 708b. The DSP 708 has a data output 710 and an address, data and control bus 712 to couple the DSP to permanent program memory 714 such as flash RAM or ROM. Permanent program memory 714 stores code and optionally data structures or data structure definitions for DSP 708.

As illustrated program memory 714 includes SISO equalisation code 714a comprising initialisation code, particle grid generating code, path generating code, signal likelihood determination code, and sequence estimation code (to estimate a transmitted symbol sequence based upon determined signal likelihood values). This code, when running on DSP 708, implements corresponding functions, as previously described in detail. Data memory 708b stores the particle grid. Program memory 714 also includes MIMO channel estimation code 714b to provide a MIMO CIR estimate and optionally, in a turbo equaliser embodiment de-interleaver code 714c, interleaver code 714d, and space-time (or other) SISO decoder code 714e (examples of which are well known to those skilled in the art). Optionally the code in permanent program memory 714 may be provided on a carrier such as an optical or electrical signal carrier or, as illustrated in FIG. 7, a floppy disk 716. The data output 710 from DSP 708 is provided to further data processing elements of receiver 700 (not shown in FIG. 7) as desired. These may include a block error decoder such as a Reed-Solomon decoder (although this could be part of the turbo decoder), and a baseband data processor for implementing higher level protocols.

The receiver front-end will generally be implemented in hardware whilst the receiver processing will usually be implemented at least partially in software although one or more ASICs and/or FPGAs may also be employed. The skilled person will recognise that all the functions of the receiver could be performed in hardware and that the exact point at which the signal is digitised in a software radio will generally depend upon a cost/complexity/power consumption trade-off.

Figure 8A:
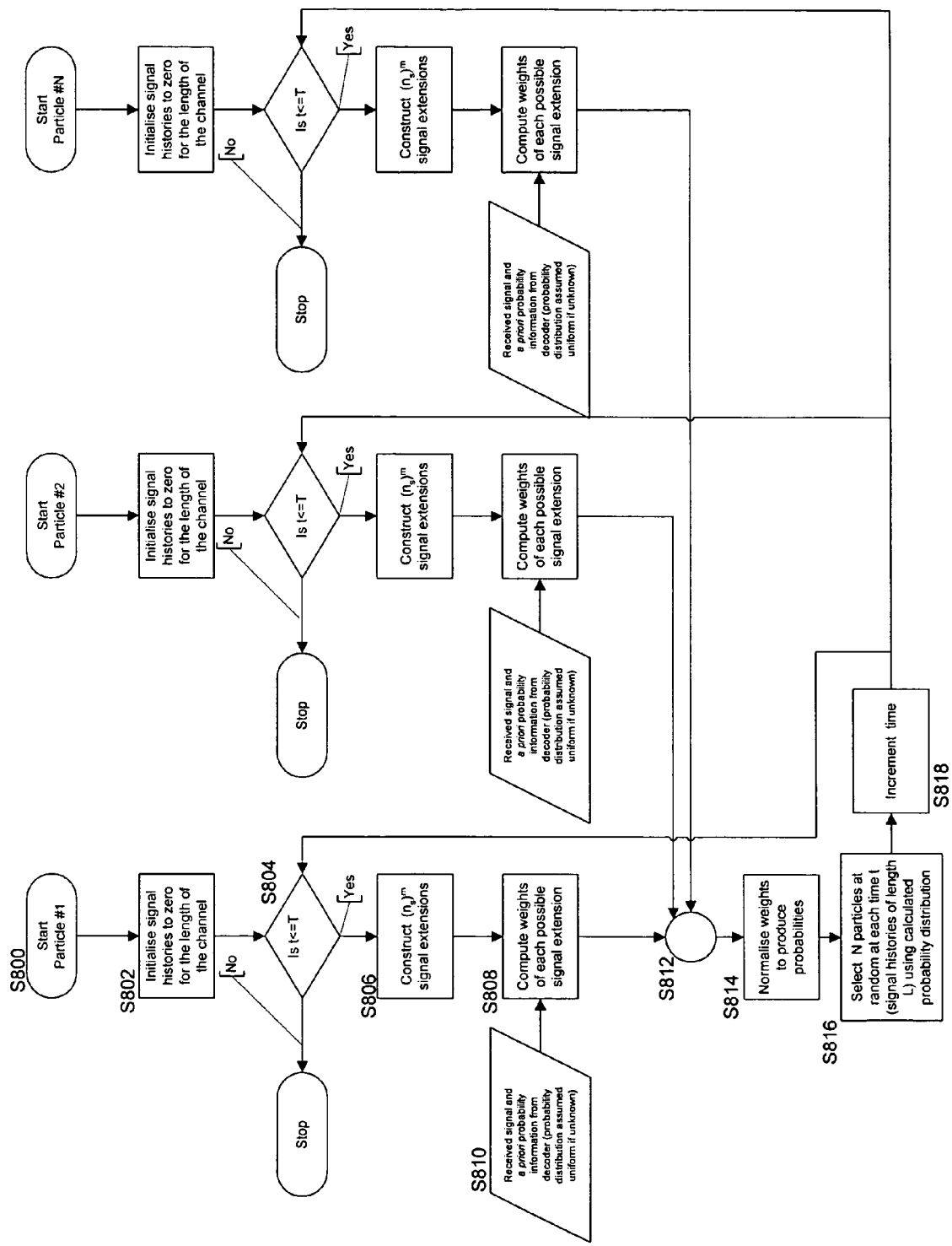
FIGS. 8a, 8b and 8c show, respectively, flow diagrams of a particle grid construction procedure, a path generation procedure, and a marginal posterior probability determination procedure according to an embodiments of the present invention.

FIG. 8a shows a flow diagram of a particle grid construction procedure, portions of which may operate in parallel, as shown. The procedure for a particle begins at step S800. At step S802 the procedure initialises signal histories to zero for the length of the channel; at step S804 the system checks whether $t<=T$ (here we assume starting at $t=1$) and if not stops, otherwise continuing to S806 to construct $(n_s)^m$ signal extensions. At S808 the procedure computes weights of each possible signal extension using received signal and a priori probability information from decoder (probability distribution assumed uniform if unknown) (from step S810). At step S812 the procedures for the three (in practice there are N) illustrated particles converge and at step S814 the process normalises weights to produce probabilities and then selects N particles at random at each time t (signal histories of length L) using calculated probability distribution (step S816) before incrementing time (step S818) and looping back to step S804.

Figure 8B:
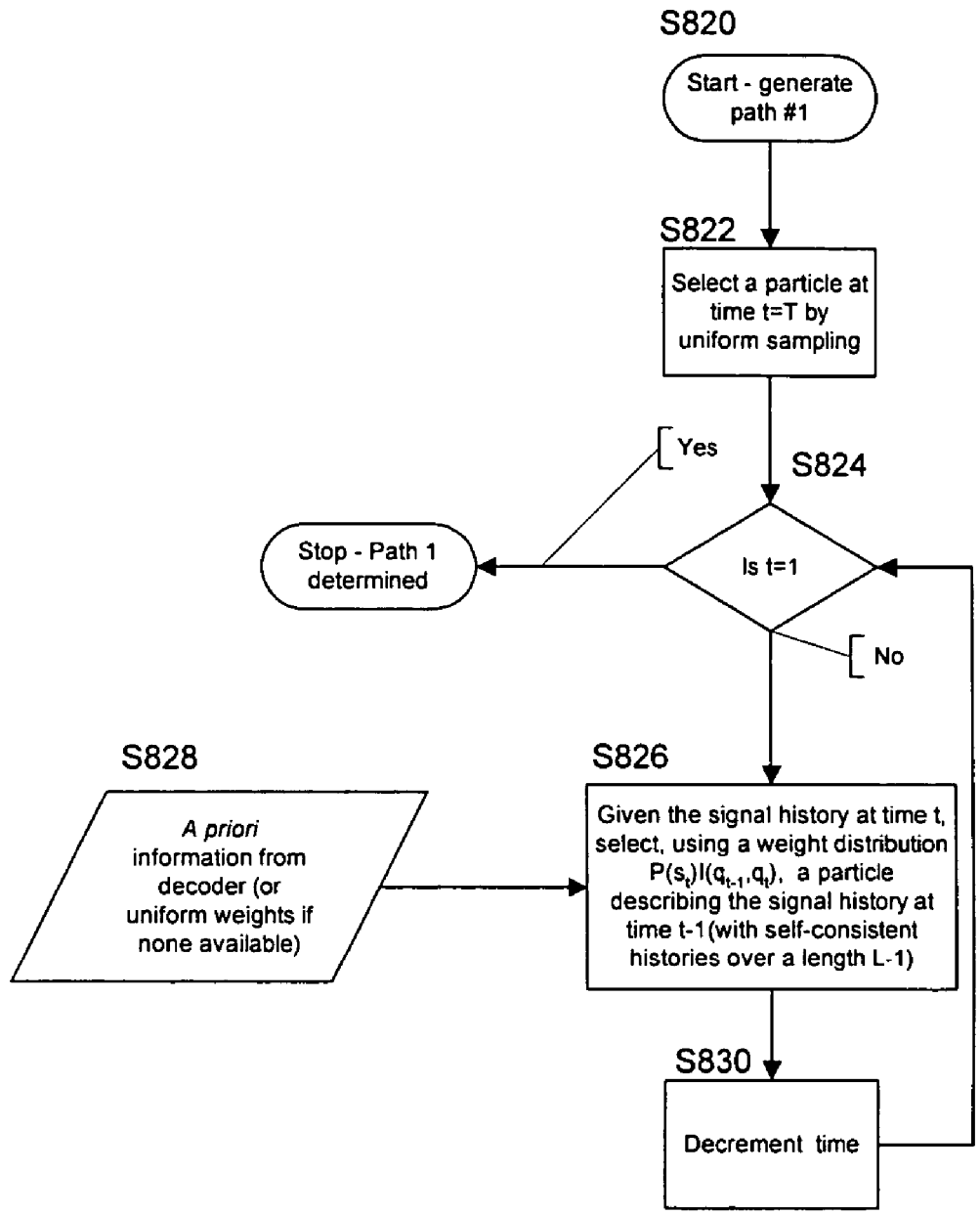

FIG. 8b shows a flow diagram of a path generation procedure, which begins at step S820. At step S822 the procedure selects a particle at time $t=T$ by uniform sampling then, at step S824, tests whether $t=1$ and if so stops. Otherwise it continues to step S826 to, given the signal history at time t, select, using a weight distribution $P(s_t)I(q_{t-1},q_t)$, a particle describing the signal history at time t-1 (with self-consistent histories over a length L-1), using a priori information from decoder (or uniform weights if none available) from step S828. The procedure then, at step S830, decrements time and loops back to step S824.

Figure 8C:
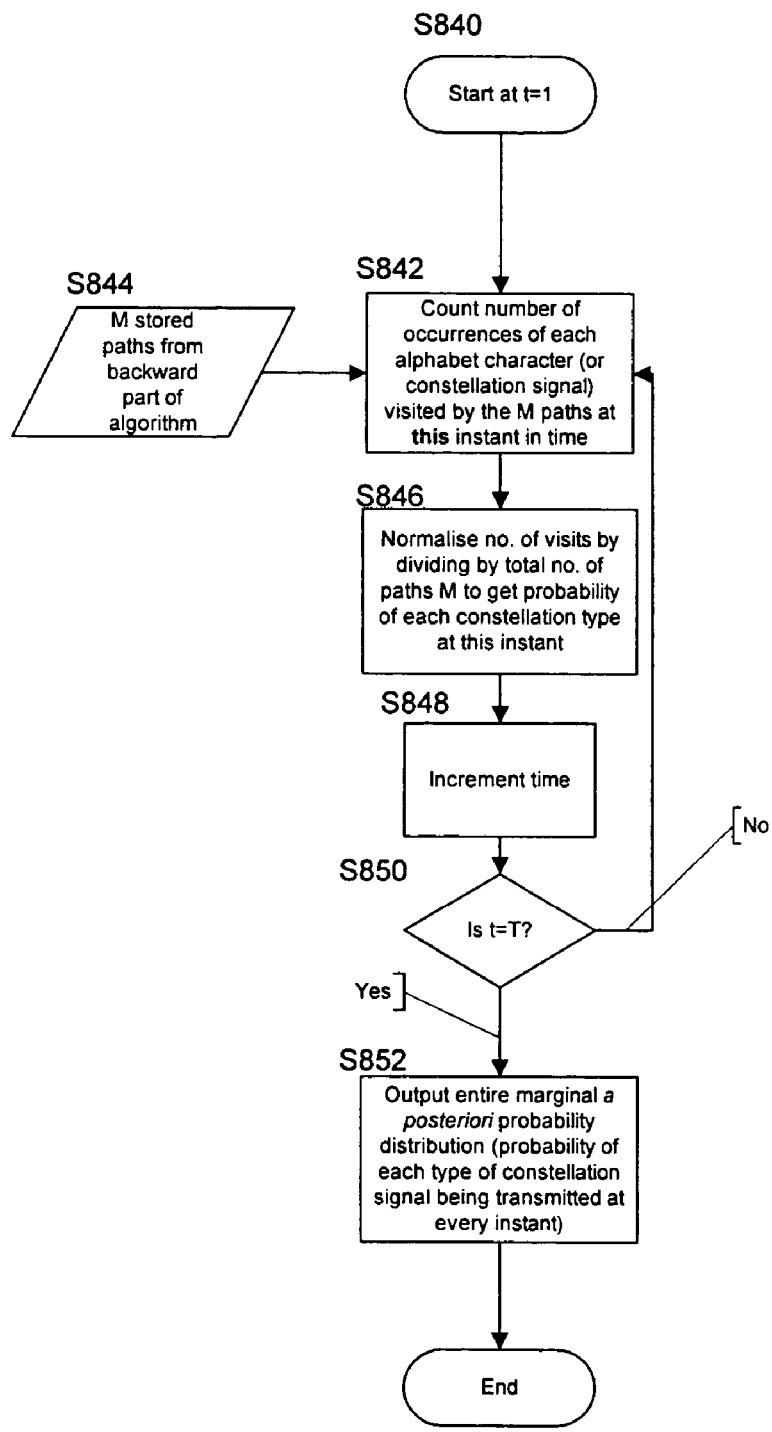

FIG. 8c shows a flow diagram of a marginal posterior probability determination procedure, starting at step S840 with $t=1$. The procedure counts the number of occurrences of each alphabet character (or constellation signal) visited by the M paths at this instant in time (step S842), using the M stored paths from backward part of algorithm (step S844). Then the procedure normalises the number of visits by dividing by total no. of paths M to get probability of each constellation type at this instant (S846), increments time (S848), checks whether $t=T$ (S850), loops back if not, and otherwise outputs the entire marginal a posteriori probability distribution (probability of each type of constellation signal being transmitted at every instant) (S852).

Figure 9:
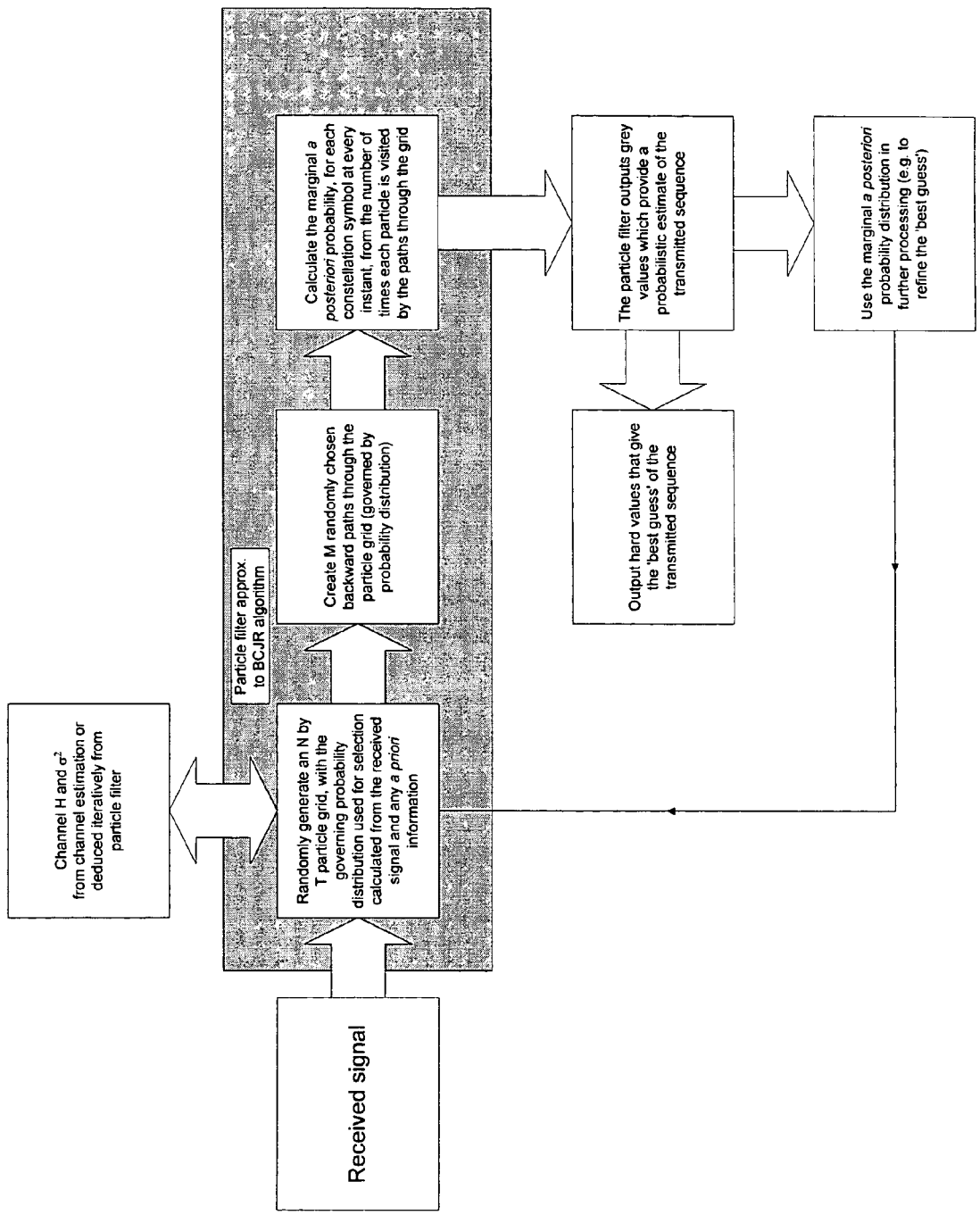
FIG. 9 shows a block diagram of a signal decoder according to an embodiment of the present invention.

FIG. 9 shows a block diagram of a signal decoder. It has blocks to input a received signal and randomly generate an N by T particle grid, with the governing probability distribution used for selection calculated from the received signal and any a priori information (using channel H and noise variance information from channel estimation or deduced iteratively from particle filter), create M randomly chosen backward paths through the particle grid (governed by probability distribution), and calculate the marginal a posteriori probability, for each constellation symbol at every instant, from the number of times each particle is visited by the paths through the grid (the particle filter approximation to the BCJR algorithm). The particle filter outputs grey values which provide a probabilistic estimate of the transmitted sequence. It may output hard values that give the 'best guess' of the transmitted sequence or, optionally, Use the marginal a posteriori probability distribution in further processing (e.g. to refine the 'best guess').

We have described detection methods, based upon a pseudo-exhaustive state-space search strategy, for reduced complexity decoding of telecommunications signals. These address the apparently intractable problem of exhaustive searching by employing a multi-stage statistical reduction of the number of candidate signals. In these methods it is the way in the number of combinations is reduced by a large factor to a manageable size, whilst retaining the statistically (potentially) relevant items, that is particularly helpful in the context of telecommunications problems.

Applications of the invention have been mainly described in the context of MIMO equalisation and a MIMO system with time domain coding but the techniques can also be applied to many other algorithms, such as single input channel equalization and channel decoding, for example for processing signals in single transmit antenna and/or single receive antenna systems. Further embodiments have applications in frequency domain coded systems such as MIMO-OFDM (Orthogonal Frequency Division Multiplexed) systems, for example developments of the European Hiperlan/2 or US IEEE 802.11 a standards for 54 Mbps wireless networks. Embodiments of the invention may also be employed in non-wireless applications such as magnetic or optical disk drive read head circuitry where, for example, multiple layers of a disk in effect act as multiple transmitters, one or more heads receiving read data influenced by "transmitted" signals from more than one layer.

No doubt many other effective alternatives will occur to the skilled person. It will be understood that the invention is not limited to the described embodiments and encompasses modifications apparent to those skilled in the art lying within the spirit and scope of the claims appended hereto.

I claim:

1. A method of estimating values for signals of a sequence of signals transmitted from a transmitter through a channel to a receiver, providing a received signal, the method employing a plurality of particles, each particle comprising a postulated transmitted signal history, the method comprising:
    initializing a set of said particles;
    evolving said set of particles over time using said received signal to generate a succession of evolved sets of particles;
    tracing a plurality of paths through said succession of evolved sets of particles backwards in time; and
    determining a sequence of values for said transmitted sequence of signals using said paths.

2. A method as claimed in claim 1 wherein said evolving of a set of particles comprises:
    determining a set of candidate successor particles and associated candidate particle weights; and
    selecting particles for an evolved set from said set of candidate particles based upon said weights.

3. A method as claimed in claim 2, comprising determining weights for said successor particles dependent upon said received signal.

4. A method as claimed in claim 3 wherein said determining of a said successor particle weight comprises comparing a postulated transmitted signal associated with said successor particle, modified by a response of said channel, with said received signal.

5. A method as claimed in claim 4 wherein said channel response is determined at least in part using said values for said transmitted sequence of signals.

6. A method as claimed in claim 2 wherein said weights define a probability distribution for said selecting, the method further comprising flattening said probability distribution prior to said selecting.

7. A method as claimed in claim 1 wherein said signal history comprises a history over a length of said channel.

8. A method as claimed in claim 1 wherein said path tracing comprises selecting transitions between particles of successively evolved sets of particles, working from a later set of particles to an earlier set of particles.

9. A method as claimed in claim 8 wherein said transition selecting selects only allowed transitions.

10. A method as claimed in claim 9 wherein a said allowed transition comprises a transition between particles which share at least a portion of their signal histories.

11. A method as claimed in claim 8 wherein each transition has an associated transition likelihood value and wherein said selecting of a transition is dependent upon said transition likelihood value.

12. A method as claimed in claim 1 wherein said values for said transmitted sequence of signals comprise likelihood values for signals of said sequence.

13. A method as claimed in claim 12 wherein said determining of said sequence of likelihood values for said transmitted signal sequence comprises determining a likelihood value for a most likely transmitted signal value at a time corresponding to an evolved set of particles for each evolved set of particles.

14. A method as claimed in claim 13 wherein said determining of a transmitted signal likelihood value for an evolved set of particles comprises counting the number of said paths through particles in said evolved set having said transmitted signal value at a time corresponding to said evolved set.

15. A method as claimed in claim 1 further comprising using said likelihood values as a priori information for repeating said evolving, tracing and determining for improving said estimating.

16. A method of estimating a transmitted sequence of signals comprising estimating likelihood values as claimed in claim 11 and estimating said transmitted sequence by making decisions on said transmitted signals of said sequence using said likelihood values.

17. A method as claimed in claim 16 wherein said transmitter has a plurality of transmit antennas and wherein a said particle comprises a postulated signal history for each said transmit antenna.

18. A method as claimed in claim 1 wherein said transmitter has a plurality of transmit antennas and wherein a said particle comprises a postulated signal history for each said transmit antenna.

19. A method as claimed in claim 1 in which said evolving over time and said tracing backwards in time comprises additionally or alternatively evolving over frequency and tracing backwards in frequency.

20. A method of equalizing received signal data using the method of claim 1.

21. A carrier carrying processor control code to, when running, implement a method of estimating values for signals of a sequence of signals transmitted from a transmitter through a channel to a receiver, providing a received signal, the method employing a plurality of particles, each particle comprising a postulated transmitted signal history, the method comprising:
    initializing a set of said particles;
    evolving said set of particles over time using said received signal to generate a succession of evolved sets of particles;
    tracing a plurality of paths through said succession of evolved sets of particles backwards in time; and
    determining a sequence of values for said transmitted sequence of signals using said paths.

22. A signal estimator for estimating values for signals of a sequence of signals transmitted from a transmitter through a channel to a receiver providing a received signal, the estimator employing a plurality of particles, each particle comprising a postulated transmitted signal history, the estimator comprising:
    means for initializing a set of said particles;

means for evolving said set of particles over time using said received signal to generate a succession of evolved sets of particles;

means for tracing a plurality of paths through said succession of evolved sets of particles backwards in time; and means for determining a sequence of values for said transmitted sequence of signals using said paths.

23. An equalizer including the signal estimator of claim 22.

24. A signal processor configured to provide a soft output of transmitted signal values from a received signal comprising:

a first filter configured to generate a time sequence of sets of samples from populations of candidate samples weighted using said received signal, each sample corresponding to a sequence of transmitted signal values;

a second filter to select a plurality of time sequences of said samples from said time sequence of sets of samples; and a signal estimator to estimate a sequence of transmitted signal values from said plurality of sample time sequences to provide said soft output.

25. A signal processor as claimed in claim 24 wherein said first filter is configured to generate said time sequence by selecting said sets of samples from said populations in accordance with said weighting of said candidate samples.

26. A signal processor as claimed in claim 25 wherein said weighting is further dependent upon a channel response for a channel between said transmitter and said receiver.

27. A signal processor as claimed in claim 24 wherein said second filter is configured to select a said time sequence by tracing a path of allowed transitions between said samples of said sets of samples.

28. A signal processor as claimed in claim 27 wherein said tracing traces from a first sample- to a second sample, said second sample representing a sequence of signal values for an earlier time than said first sample.

29. A signal processor as claimed in claim 24 wherein said first filter comprises a particle filter.

30. A signal processor as claimed in claim 24 wherein said received signal comprises signals received simultaneously from a plurality of transmitting devices, and wherein said signal processor configured for estimating a sequence of transmitted signal values for each said transmitting device.

31. An equalizer incorporating the signal processor of claim 24.

32. A signal processor configured to provide a hard output of transmitted signal values from a received signal comprising: a signal processor configured to provide a soft output of transmitted signal values from a received signal comprising:

a first filter configured to generate a time sequence of sets of samples from populations of candidate samples weighted using said received signal, each sample corresponding to a sequence of transmitted signal values;

a second filter to select a plurality of time sequences of said samples from said time sequence of sets of samples; and a signal estimator to estimate a sequence of transmitted signal values from said plurality of sample time sequences to provide said soft output, and decision means to provide a hard output from said soft output.

33. A signal processor as claimed in claim 32 wherein said received signal comprises signals received simultaneously from a plurality of transmitting devices, and wherein said signal processor configured for estimating a sequence of transmitted signal values for each said transmitting device.

34. An equalizer incorporating the signal processor of claim 32.

35. Processor control code to, when running, implement a signal processor configured to provide a soft output of transmitted signal values from a received signal comprising:

a first filter configured to generate a time sequence of sets of samples from populations of candidate samples weighted using said received signal, each sample corresponding to a sequence of transmitted signal values;

a second filter to select a plurality of time sequences of said samples from said time sequence of sets of samples; and a signal estimator to estimate a sequence of transmitted signal values from said plurality of sample time sequences to provide said soft output.

36. A signal processor configured to provide a hard output of transmitted signal values from a received signal comprising:

a signal processor configured to provide a soft output of transmitted signal values from a received signal comprising:

a first filter configured to generate a time sequence of sets of samples from populations of candidate samples weighted using said received signal, each sample corresponding to a sequence of transmitted signal values;

a second filter to select a plurality of time sequences of said samples from said time sequence of sets of samples; and a signal estimator to estimate a sequence of transmitted signal values from said plurality of sample time sequences to provide said soft output; and decision means to provide a hard output from said soft output.

* * * * *